(12) United States Patent
Cheung et al.

(10) Patent No.: US 6,711,873 B2
(45) Date of Patent: Mar. 30, 2004

(54) APPARATUS FOR LOADING ELECTRONIC PACKAGES OF VARYING SIZES

(75) Inventors: Yiu Ming Cheung, Kwai Chung (HK); Hoi Fung Tsang, Kwai Chung (HK); Yui Ko Wong, Kwai Chung (HK)

(73) Assignee: ASM Assembly Automation Ltd., Hong Kong (CN)

(*) Notice: Subject to any disclaimer, the term of this patent is extended or adjusted under 35 U.S.C. 154(b) by 56 days.

(21) Appl. No.: 10/041,426

(22) Filed: Nov. 7, 2001

(65) Prior Publication Data
US 2003/0084642 A1 May 8, 2003

(51) Int. Cl.[7] .............. B65B 57/10; B65B 5/06
(52) U.S. Cl. .............. 53/58; 53/496; 53/504; 53/201; 53/247; 53/250
(58) Field of Search .......... 53/249, 250, 237, 53/238, 201, 504, 67, 58, 496, 494

(56) References Cited

U.S. PATENT DOCUMENTS

| | | | | |
|---|---|---|---|---|
| 4,554,777 A | * | 11/1985 | Denk et al. | 53/201 |
| 4,565,048 A | * | 1/1986 | Lade | 53/201 |
| 4,647,269 A | * | 3/1987 | Wedel et al. | 414/421 |
| 4,717,012 A | * | 1/1988 | Swapp et al. | 198/419.1 |
| 4,775,279 A | * | 10/1988 | Linker | 414/411 |
| 4,862,578 A | * | 9/1989 | Holcomb | 29/564.1 |
| 4,914,890 A | * | 4/1990 | Olson | 53/397 |
| 5,190,431 A | * | 3/1993 | Klug et al. | 414/416.09 |
| 5,236,076 A | * | 8/1993 | Sung | 53/250 |
| 5,687,553 A | * | 11/1997 | Malanowski | 53/201 |
| 6,030,172 A | * | 2/2000 | Wong Han Boon et al. | 414/797.9 |
| 6,485,991 B1 | * | 11/2002 | Jitramas et al. | 53/250 |

* cited by examiner

Primary Examiner—Stephen F. Gerrity
(74) Attorney, Agent, or Firm—Ostrolenk, Faber, Gerb & Soffen, LLP

(57) ABSTRACT

Packages of varying dimensions are loaded into a plurality of electrical package tubes. A guide arrangement is provided, which is programmable to receive the electrical packages by automatically configuring to accommodate the varying dimensions of the electrical packages, the configuring being performed without manual intervention, and a receiving arrangement is provided to receive the electrical package tubes and configured to individually align the electrical package tubes with the guide arrangement to receive the electrical packages. Upon application of a feeding force to the electrical packages, the guide arrangement guides the electrical packages into the electrical package tubes.

31 Claims, 8 Drawing Sheets

1

APPARATUS FOR LOADING ELECTRONIC PACKAGES OF VARYING SIZES

FIELD OF THE INVENTION

This invention relates to an off-loading apparatus for placing electronic packages such as semiconductor devices into receptacles, commonly anti-static plastic tubes. Such receptacles are usually adapted to facilitate access by a pick and place handler. In particular, such off-loading apparatus is adaptable to accommodate packages and receptacles of different sizes.

BACKGROUND AND PRIOR ART

In the course of manufacturing electronic packages, singulation machines or test handlers are commonly equipped with an off-loading apparatus to load electronic packages into receptacles, such as tubes, for transporting electronic packages to the next process station or to the customer. The sizes of the packages may vary from time to time depending on the needs of the customer. Such prior apparatus generally requires significant tooling changes to the off-loading apparatus for the accommodation of these packages and of tubes of different sizes. Therefore, time is wasted for the conversion and as a result the overall up-time and productivity of the system is reduced.

Further, in prior apparatus, the conversion of tube off-loaders to accommodate electronic packages of various sizes is achieved by the use of replacement tool-sets. If the off-loader is required to handle a large variety of packages of different sizes, the user will need to keep a corresponding range of tool sets. If the conversion is done very often, the down-time can be significant.

SUMMARY OF THE INVENTION

It is an object of the invention to mitigate disadvantages of the prior art, in particular, the need to keep a whole range of replacement tool-sets to accommodate packages and receptacles of different sizes.

According to the invention, there is provided an apparatus for loading items of varying size such as electronic packages into a receptacle therefore, comprising means automatically to adjust dimension parameters of the apparatus whereby to accommodate at least packages of different size and load same into a receptacle therefor.

The present invention thus seeks to provide an improved mechanism for an off-loading apparatus. It enables automatic adjustment of the apparatus to programmable widths when the accommodation of packages of different sizes is required. If the conversion avoids the need to replace and align tooling, a shorter conversion time can be achieved.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

FIG. 6(*iii*) is a detailed view of the tube-off loading apparatus of FIG. 6(*i*).

FIG. 6(*iv*) is a detailed view of a portion of the tube off-loading apparatus of FIG. 6(*ii*).

DETAILED DESCRIPTION OF THE PREFERRED EMBODIMENT

Figure 1:
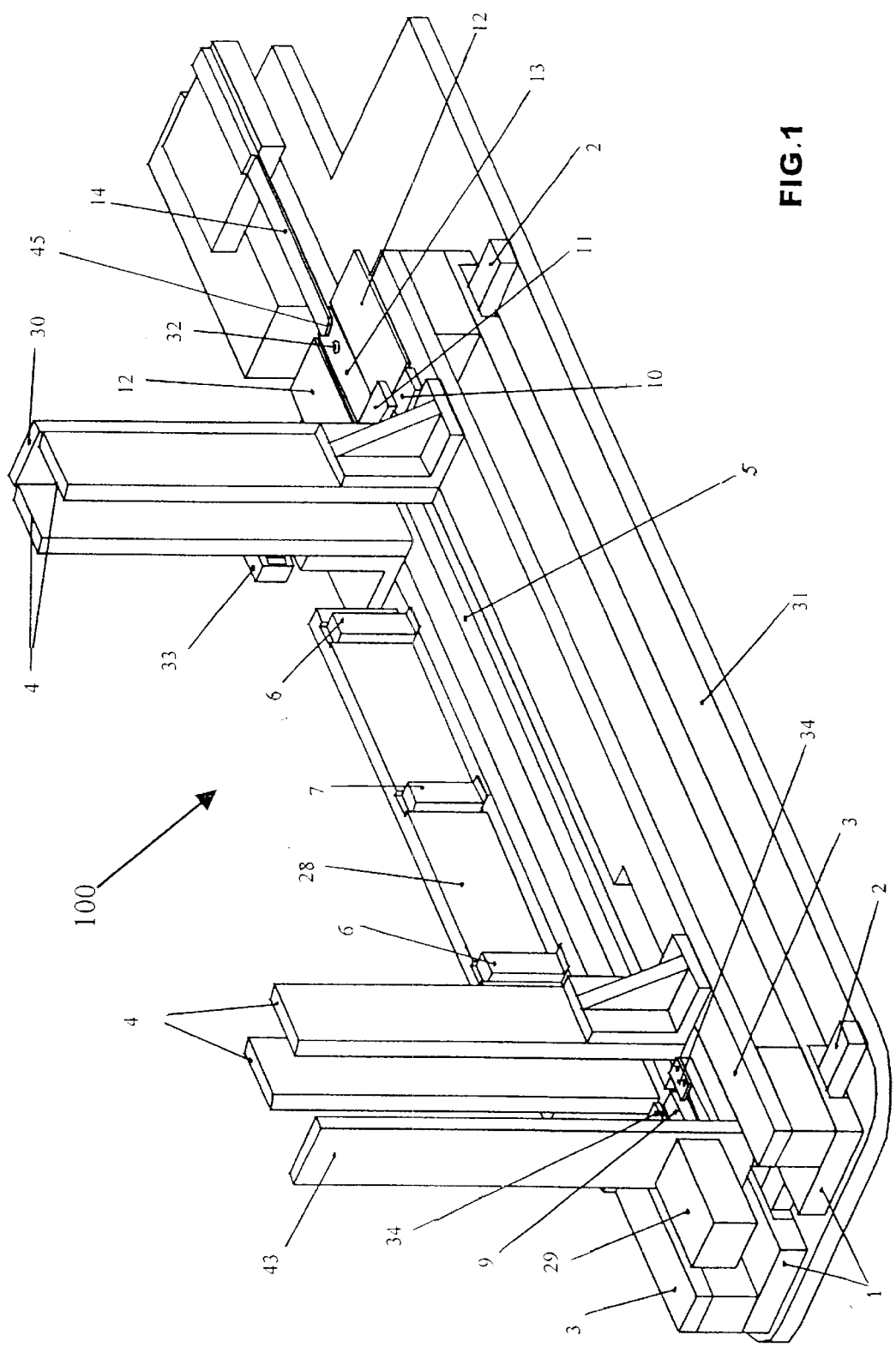
FIG. 1 is a perspective view of a tube off-loading apparatus for electronic packages according to an embodiment of the present invention.

FIG. 1 is a perspective view of a tube off-loading apparatus for electronic packages according to an embodiment of the present invention.

Figure 3:
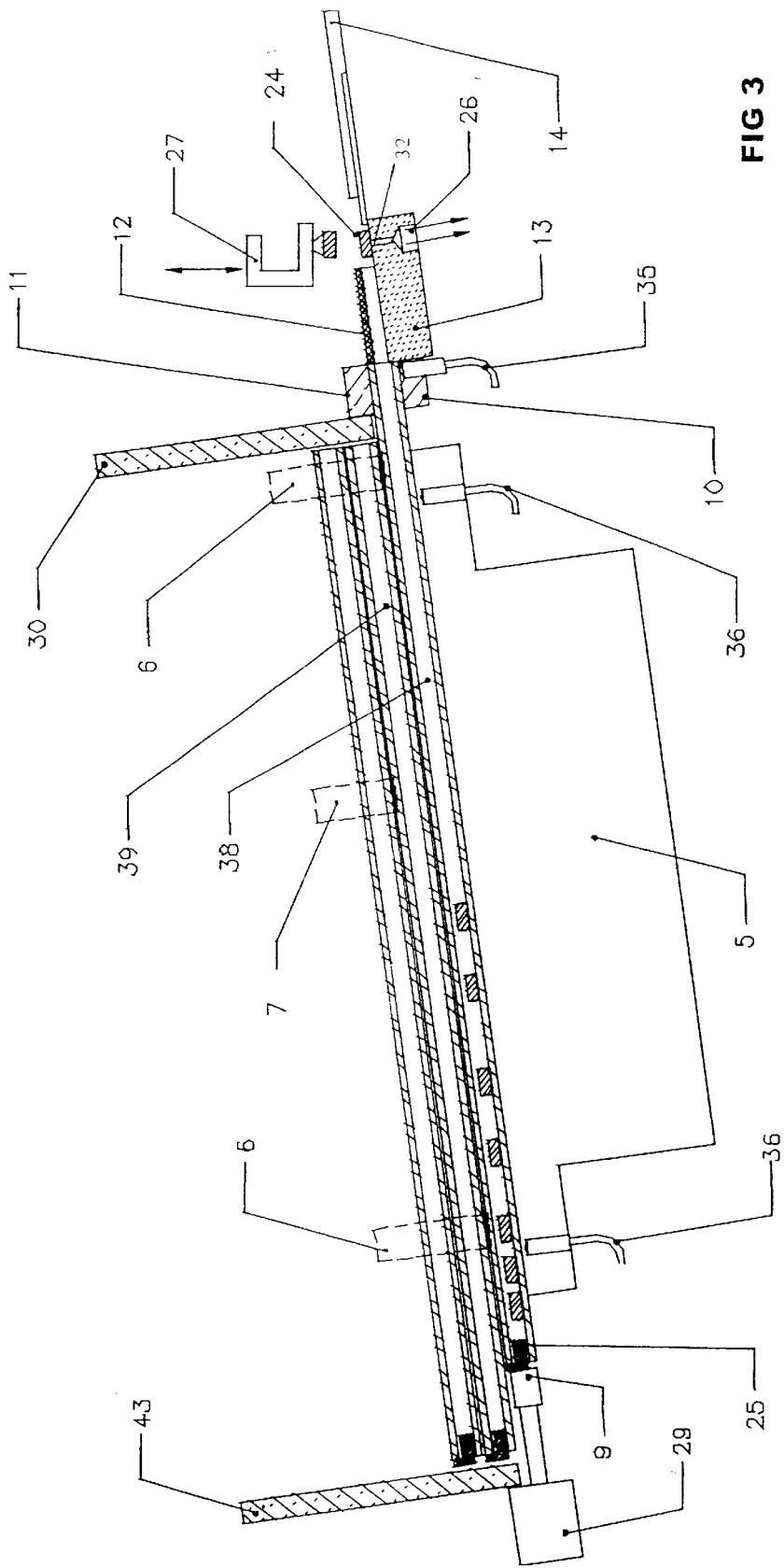
FIG. 3 is the side view of the tube off-loading apparatus of FIG. 1.

The tube off-loading apparatus 100 is mounted on a base plate 31 at an inclined angle such that electronic packages 24 being fed into the tube 38 can slide to the lower end of the tube 38 by gravity as shown in FIG. 3. Tubes 20, 38, 39 are inserted into the off-loading apparatus 100 via the top of the apparatus and they are accommodated within an area defined by a fixed tube end stopper 30, guiding brackets 4 and movable tube end stopper 43.

Mounted on the base plate 31 are a pair of lower movable platforms 1 that are driven to close or open by a movable block 16 of the width adjustment mechanism, as explained below with reference to FIG. 2(*i*). The movement of the lower movable platforms I is guided by a pair of the linear guides 2 to ensure linear motion.

Figure 2:
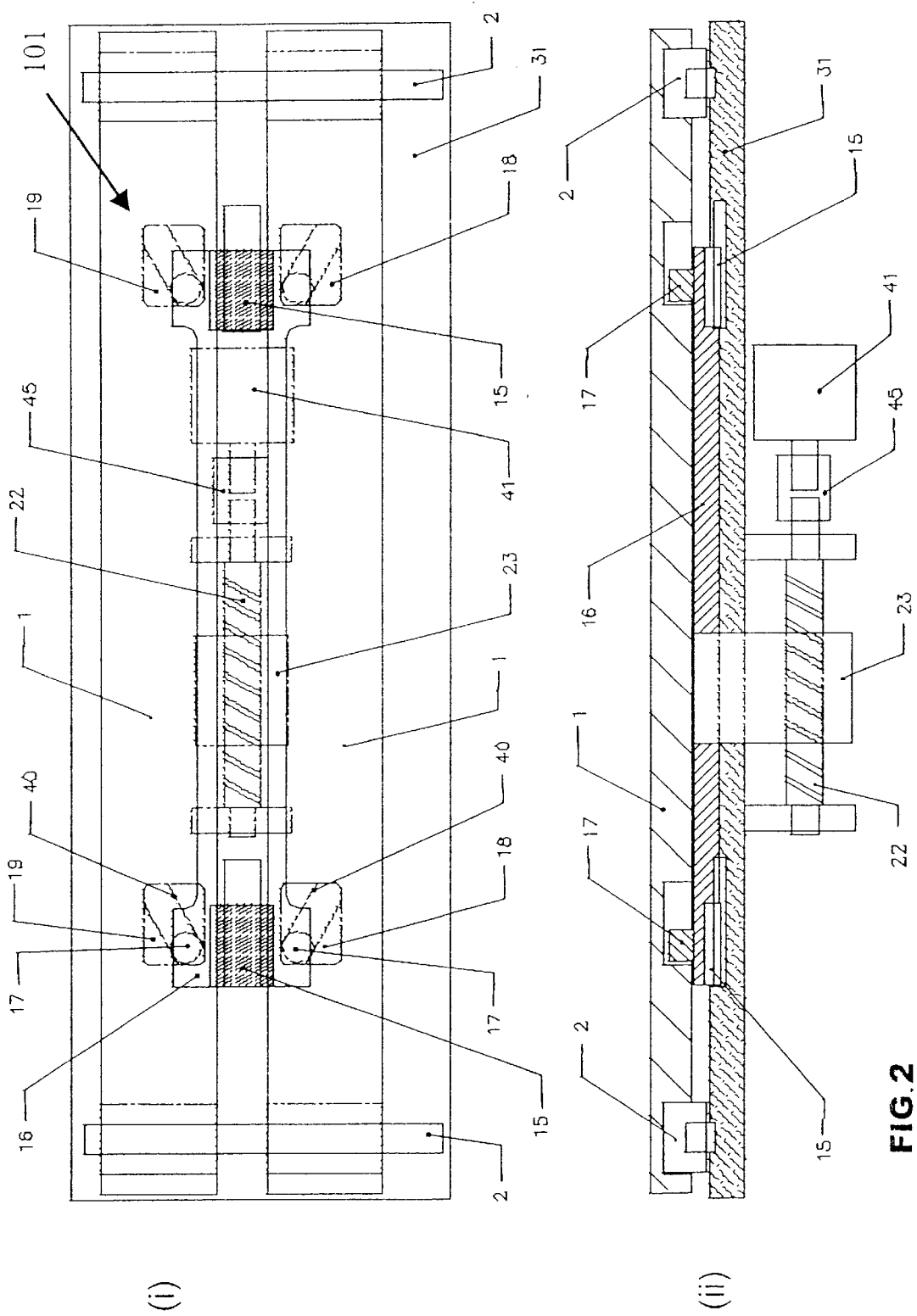
FIG. 2(*i*) and FIG. 2(*ii*) are the top and side views respectively of a width adjustment mechanism usable with the tube off-loading apparatus of FIG. 1.

Referring to FIG. 2, four cam followers 17 of which two cam followers are adjacent to each linear guide 15 are mounted on the movable block 16. Cam follower guides 18, 19 for the cam followers 17 are correspondingly fixed on the left and right of the lower movable platform 1, respectively. When the guiding block 16 moves up and down, the four cam followers 17 move along the sloped channels of their guides which are fixed on the lower movable platforms 1 and it then drives these movable platforms 1 in a direction substantially perpendicular to the motion of the movable block 16. The inclined ramp or slope 40 on these cam follower guides 18, 19 will translate the vertical up-and-down reciprocal motion of the movable block 16 to the transverse opening and closing motions of the lower movable platforms 1. With this mechanism, the pair of lower movable platforms 1 can open and close with their center-lines remaining unchanged. A pair of upper movable platforms 3 are built on top of the lower movable platforms 1. These lower and upper movable platforms 1, 3 move symmetrically about a center-line for the placement of the packages 24 and tubes 20, 38, 39. The guiding blocks 11 for the loading tubes 38, the guiding plates 12 for the packages 24 and the guiding brackets 4 for the standby tubes 20 are all mounted on these upper movable platforms 3.

The movable block 16 controlling the movement of the lower movable platforms 1 moves on another pair of linear guides 15 of the width adjustment assembly 101. The movable block 16 in turn is driven by a rotary-to-linear mechanism. This rotary-to-linear mechanism consists of a motor with encoder 41, a coupler 45, a lead screw 22 and a mounting bracket 23 for the lead screw. The movable block 16 is mounted to the lead screw bracket 23. The rotary motion of the motor 41 will then translate to linear motion of the lead screw bracket 23 and this drives the movable block 16 moving up and down as appropriate.

Figure 4:
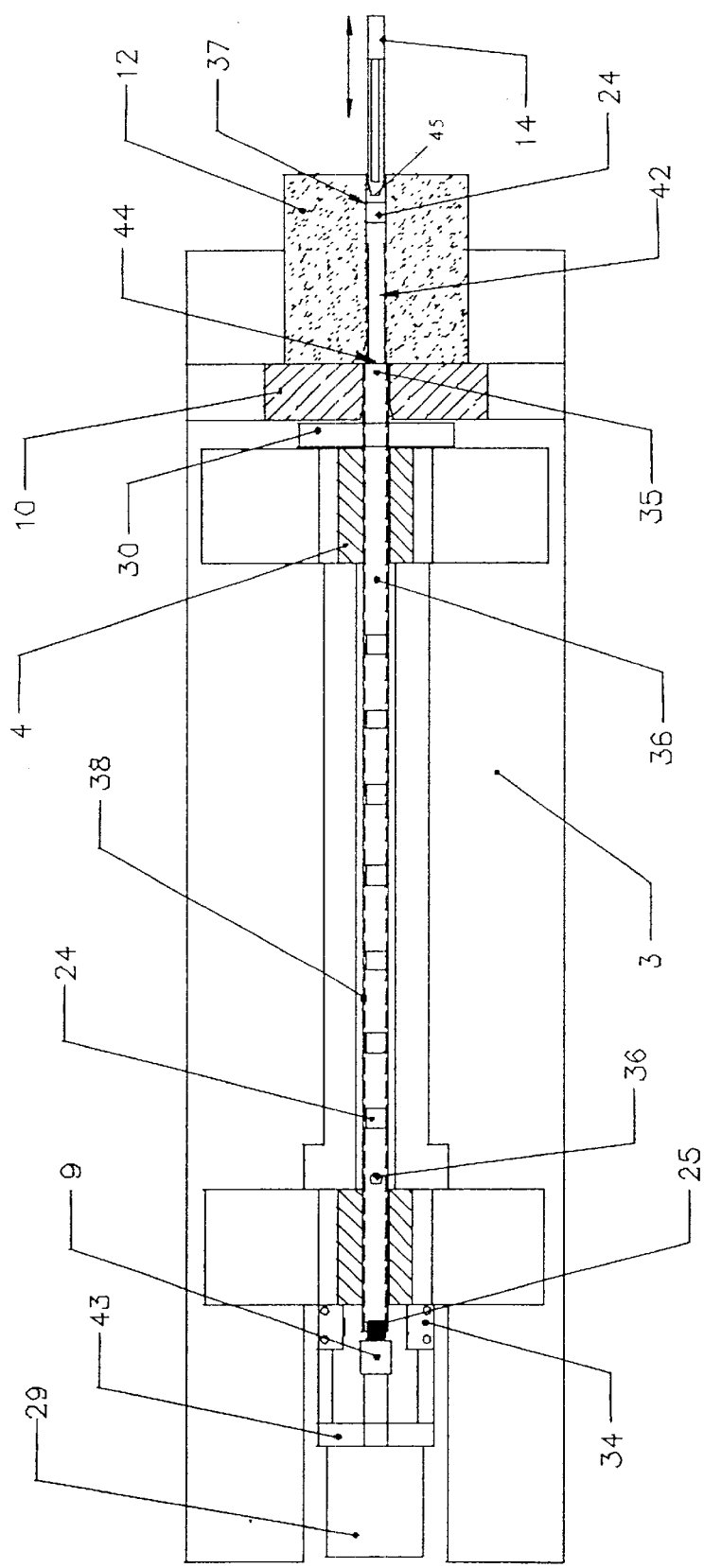
FIG. 4 is the top view of the tube off-loading apparatus of FIG. 1.

The side view and top view of the tube off-loading apparatus are shown in FIG. 3 and FIG. 4 respectively. A pair of guiding plates 12 and a pair of L-shape guiding blocks 10 are mounted on each side of the upper movable platforms 3 of programmable width. The width of the guiding plates 12 and the guiding block 10 are determined by the sizes of the package 24 and the tubes 20, 38, 39, respectively. For the same type of tubes 20, 38, 39 of different sizes, the clearance for inserting the packages 24 into the tubes 20, 38, 39 are basically the same. Hence, there is a fixed relation between the width of the guiding plates 12 and the width of the guiding blocks 10 even for guiding the packages 24 and the tubes 20, 38, 39, of various sizes. Therefore, by adjusting their widths together, it is possible to use the same pairs of guiding plates 12 and guiding blocks 10 for accommodating packages and tubes of various sizes. During tube loading, the tube is forced into these guiding blocks 10 by a tube end pusher 9 and a tube presser 11 above the tube 38 will move down to press it against the guiding blocks 10. A stationary platform 13 plus the two guiding plates 12 of appropriate width form a track to guide the packages 24 being pushed into the tube 38 by an ejector 14. This invention thus allows programmable widths for tubes 20, 38, 39 and packages 24 of different sizes to be used for off-loading the electronic packages 24.

A standby tube guiding assembly consists of (i) a pair of stoppers (the fixed tube end stopper 30 and the movable tube end stopper 43) and (ii) two pairs of guiding brackets 4. Among the two stoppers, the fixed tube end stopper 30 is fixed and located near the opening of the standby tube 20 where the packages 24 are being fed. The movable tube end stopper 43 is movable and located at the opposite end of the loading tube 38. The location of the movable tube end stoppers 43 can be adjusted according to the length of the tube 38. The two pairs of guiding brackets 4 are mounted on the upper movable platforms 3 of programmable width. One pair is mounted near each end of the upper movable platforms 3. Each pair of the guiding brackets 4 is mounted on each side of the said upper movable platforms 3. This width of this assembly can be programmable to provide guiding for the column of standby tubes 20.

Thus, the guiding brackets 4, the fixed tube stopper 30 and the movable tube end stopper 43 maintain a column of standby or subsequent tubes 20 in position. Again, the location of the movable tube end stopper 43 is adjusted according to the length of the standby tubes 20. The separation of the standby tubes 20 and a tube 38 being loaded (which is the bottom tube in a column of tubes 20, 38, 39) is carried out by activating the tube separation assembly 28. The tube separation assembly 28 consists of three fingers. Two lower level fingers 6 that extend into the stack of tubes 20, 39 at a level adjacent to the top of the loading tube 38, are located at each end and are positioned at the location wherein these fingers 6 can clamp the loading tube 38 at the bottom of the column down onto a movable support platform 5. However, an upper level finger 7 is located at the middle of the tube separation assembly 28 and is positioned at a level being equal to the thickness of one tube above the two lower level fingers 6. When the tube separation assembly 28 moves outwards, the whole column of tubes will fall by force of gravity onto the support platform 5. The loading tube 38 will be separated and left at the bottom, supported by the support platform 5 when the tube separation assembly 28 moves in and these fingers 6 and 7 insert into the standby tube 20. The tube 39 above the last loading tube 38 will then be held by these fingers 6 and 7 and the rest of the standby tubes 20 are also supported by them.

By programming the number of revolutions of the motor 41, one can change the width of the guiding bracket 4 for accommodating standby tubes governed by the separation between the pair of the upper movable platforms 3. The guiding blocks 11 for fixing the loading tube 38, the guiding plates 12 for guiding the incoming package 24 and the guiding brackets 4 for accommodation of the standby tubes 20 are all mounted on these upper movable platforms 3. Hence, the width of the tube off-loader assembly on top of these upper movable platforms 3 is programmable. The width of these assemblies can be adjusted by programmable means through, for example, microprocessor control or even manual adjustment.

The system will return to its initial state by resetting the system or by forced initialization. The widths of the guiding blocks 10, guiding plates 12 and guiding brackets 4 will not be changed during initialization unless it is commanded by the user. At its initial state, the tube separation assembly 28 will be at a forward position or 'in' position and is ready to hold the standby tubes 20. The tube end pusher 9 which is driven by an air cylinder 29 retracts and stays at a rearward position. The tube presser 11 will be moved up to release any tube inside the L-shaped tube guiding blocks 10. The ejector 14 will move to its extended tube eject position to clear up any remain package 24 in the guiding plates 12 or the loading tube 38 in L-shaped guiding blocks 10. It is then retracted to its initial or home position.

All the guiding assemblies (such as the guiding plates 12, the guiding blocks 10, and the guiding brackets 4) should be preset to the appropriate width for loading the right size of packages 24 and tubes 20, 38, 39. The guiding plates 12 at appropriate width together with a stationary platform 13 form a guiding track for loading the incoming packages 24. The user will put the standby tubes 20 into the tube guiding brackets 4 up to the level above height sensor 33 that is used for warning about the level of the loaded standby tubes 20. The user loads the tubes 20 in such a way that the open end faces the fixed tube end stopper 30 and the tube end with end plug 25 faces the movable tube end stopper 43. If the orientation of the loading tube 38 is wrong, the orientation sensor 34 will detect the absence of end plug 25 and give an error signal to the controller. The normal operation will start with the loading of a new standby tube for feeding the incoming package 24.

Figure 5:
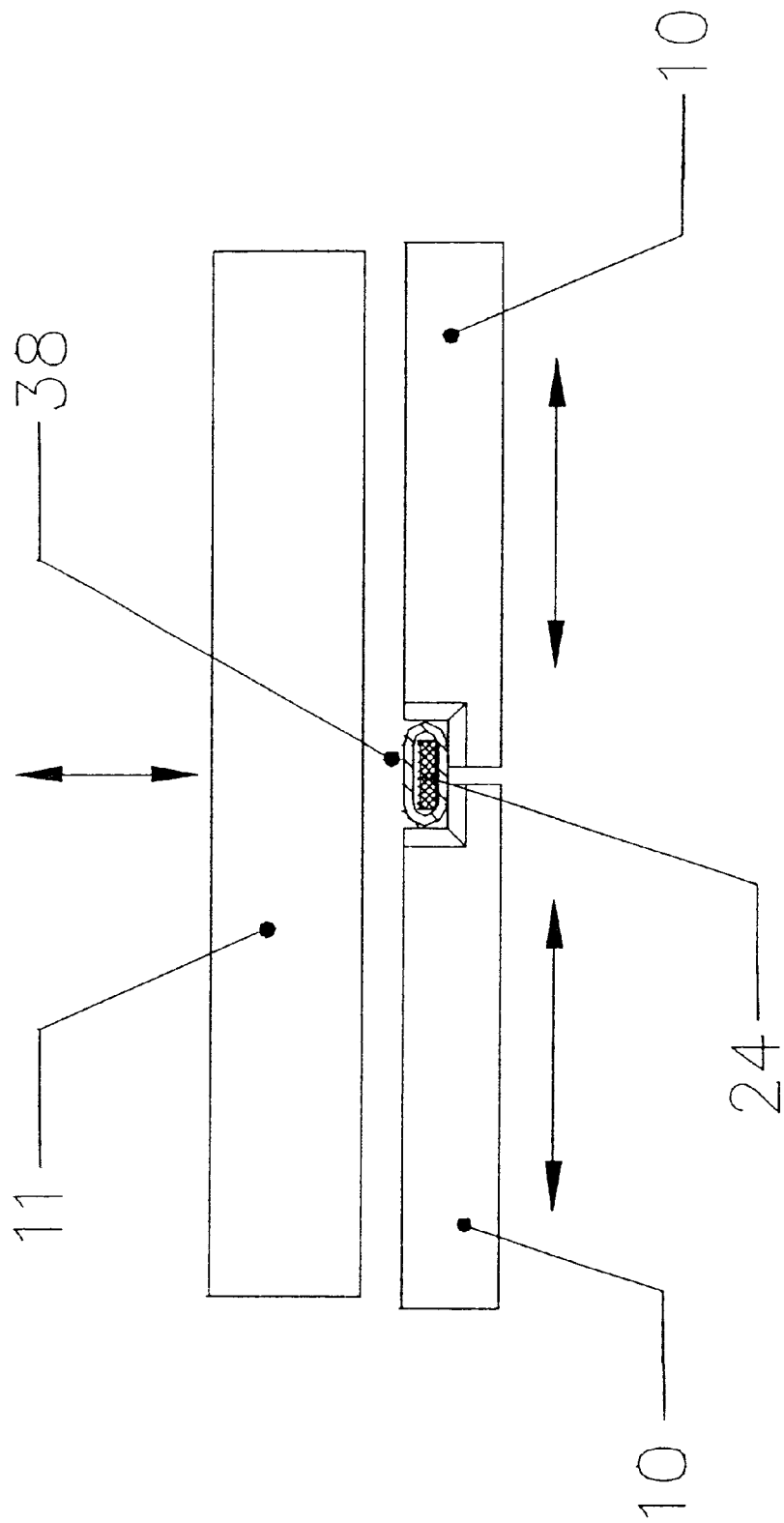
FIG. 5 is a section view of a tube pressed by a tube presser inside L-shape guiding blocks of the width adjustment mechanism.

A sectional view of loading tube 38 pressed by the tube presser 11 inside the L-shape guiding blocks 10 is shown in FIG. 5. The system is now ready to load the incoming packages 24 into the tube 38.

Figure 6:
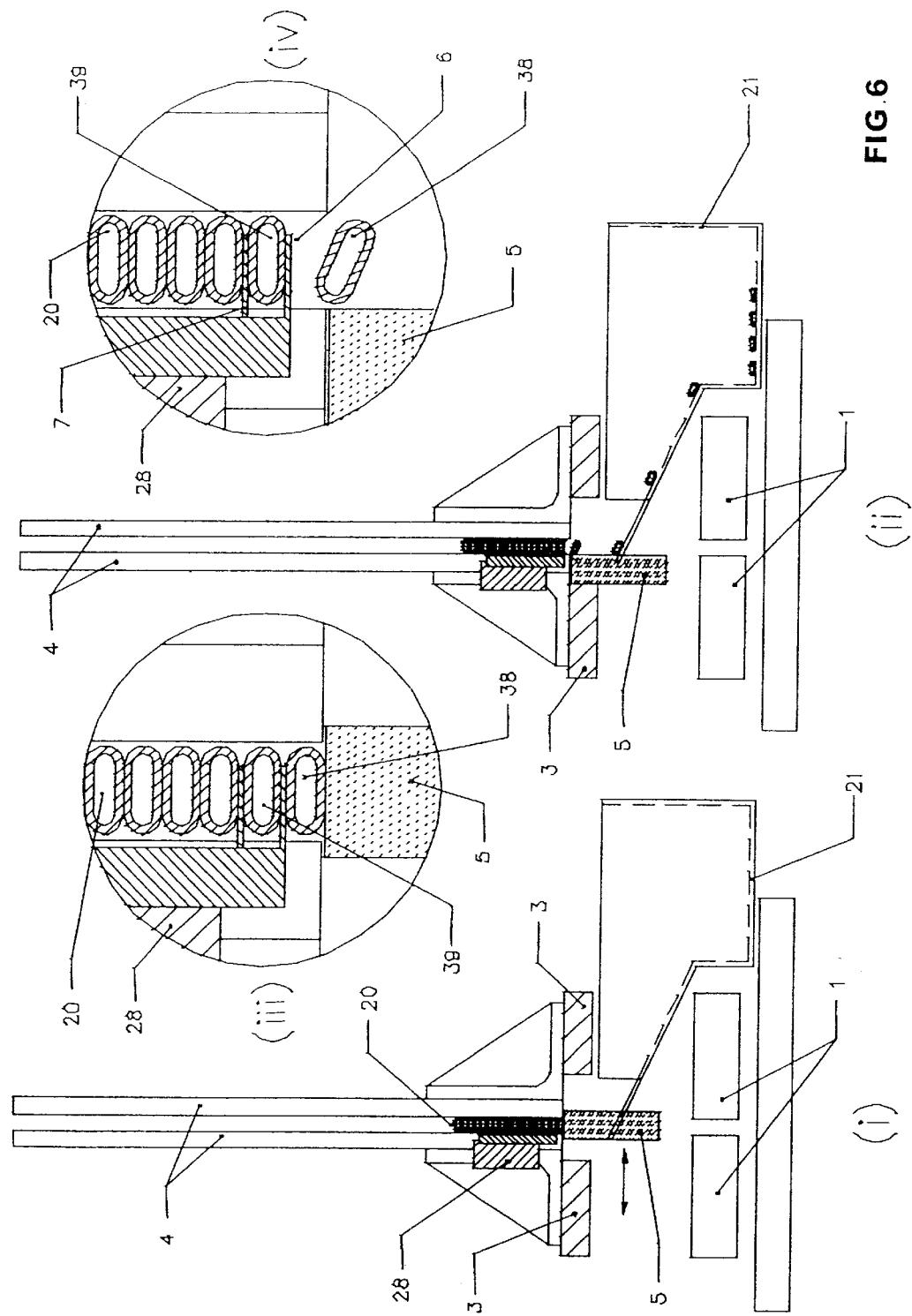
FIG. 6(*i*) and FIG. 6(*ii*) are front elevation views of the tube off-loading apparatus of the present invention, when it is (i) configured for loading packages, and (ii) configured for unloading tubes.

FIG. 6 shows the front view of the present invention with (i) the configuration for loading the package and (ii) the configuration for unloading the tube.

With reference to FIG. 6(*i*), two pairs of guiding brackets 4 of appropriate width provide a guide for the column of standby tubes 20. The tubes 20 are stacked one above the other and are supported by the fingers 6, 7 of the tube separation assembly 28 except the last tube 38 at bottom, which is supported on a movable support platform 5. The bottom tube 38 is the one for loading the incoming packages 24. The tube separation assembly 28 is used to separate the tube 38 at the bottom and the ones above it. The separated tube 38 is pushed forward by the tube end pusher 9 into the tube and package guiding blocks 10 and then is pressed by the presser 11 tightly in the tube holder mechanism, where the tube 38 will receive the incoming packages 24. The incoming packages 24 will be placed at the package placement location of the vacuum suction to help the landing of the package. An ejector 14 will push the package 24 on the stationary platform 13 along the guide into the loading tube.

The sequence of loading a new tube is explained in detail as follows:

(i) The tube separation assembly 28 will move out to rearward position and let the standby tubes 20 drop onto the support platform 5 by free fall. There is a slight delay to allow this action to complete.

(ii) Next, the tube separation assembly 28 moves back to a forward position. The fingers 6 and 7 of the tube separation assembly 28 will be inserted into the column of the tubes. The fingers 6 will separate and clamp the loading tube 38 at the bottom. The rest of tubes 20 on top of it will be supported by the finger 7 and the tube 39 is held inside the fingers 6 and 7.

(iii) Next, the tube end pusher 9 will be actuated by a solenoid 29 to move forward and push the tube 38 into the tube guiding blocks 10. If the tube 38 fails to insert into the guiding blocks 10, the tube presence sensor 35 will be triggered and give an error signal.

(iv) The tube presser 11 will then move down to press the tube 38 against the guiding blocks 10. The tube loading cycle is complete.

The exploded view of FIG. 6(*iii*) shows the loading 38 on support platform 5 being clamped by the finger 6 of the separation assembly 28.

Turning again to FIG. 3 to illustrate the loading of packages 24 into the loading tube 38, the incoming package 24 is placed by a pick arm 27 onto the tube off-load landing position where a vacuum hole 32 can provide vacuum suction to assist in the landing of the package 24. There is a vacuum pressure sensor (not shown) connecting to vacuum source 26. If the package 24 is not placed on the landing position, the vacuum pressure sensor will trigger and give an error signal. The ejector 14 will then move forward to push the package 24 into the loading tube 38 along the track on the stationary platform 13. The width of the said track is defined by the package guiding plates 12. Before the ejector 14 retracts, it will move to a position such that the package 24 is received by the tube 38. At the tip of the ejector 14 a small nozzle 45 blows air to the package 24 and prevents it from sticking to the ejector 14 during retraction.

The package 24 will then be pushed into the loading tube 38 and the ejector 14 will retract to its standby position and prepares for the loading of the next package. The number of packages 24 being fed to the loading tube 38 is programmable and a limit counter can be set to the tube off-load controller. For each package loading cycle, the value of a running counter will be increased by one. As this counter reaches the preset limit, the controller will initiate a sequence of motions to unload the loaded tube 38. As the preset number of packages 24 being fed to the tube is reached, the tube end pusher 9 will retract and the standby tube 20 will be pushed out from the guiding blocks 10 by the ejector 14 moving to an extended position. Meanwhile, the movable support platform 5 moves transversely to one side away from the loaded tube 38. This action allows the loaded tube 38 to free fall onto the tube collector 21 below it. The rest of the other tubes above it are still held by the support of the tube separation assembly 28.

During this unloading the movable support platform 5 move to a rearward or 'out' position to allow the loading tubes 38 to drop into the tube collector 21 underneath. If in case the tube is not able to drop into the tube collector 21, two tube sensors 36, one near each end of the loading tube 38 and mounted underneath and along the center-line of the tube 38, will trigger and give a warning signal to the controller. If it is clear, the movable support platform 5 will then move back to forward position or 'in' position and is ready to support the next loading tube 38.

The tube unloading sequence is explained in detail as follows with reference to FIG. 6(*ii*):

(i) the tube end pusher 9 will retract to its initial or home position, (ii) the tube presser 11 will move up to release the tube 38, (iii) the ejector 14 will move forward to its extended position such that the tube 38 will be pushed out from the tube guiding blocks 10, (iv) the movable tube support platform 5 will move out to the backward position on the left, (v) The loading tube 38 will then free fall and drop into the tube collector 21.

The column of standby tubes 20 and the tube 39 just on the top of unloaded tube 38 will be held and supported by the fingers 6 and 7 of the tube separation assembly as shown in FIG. 6(*iv*). After the loaded tube 38 is unloaded, the moveable platform 5 will more back into forward position where it is ready to support a new empty tube being set in place for loading the incoming packages 24. The fingers 6, 7 of these separators will support the whole column of tubes and separate the last bottom tube 38 and the rest of the standby tubes 20 above it. The tube 39 just above the bottom tube 38 will be inserted into the three fingers of separators.

Figure 7:
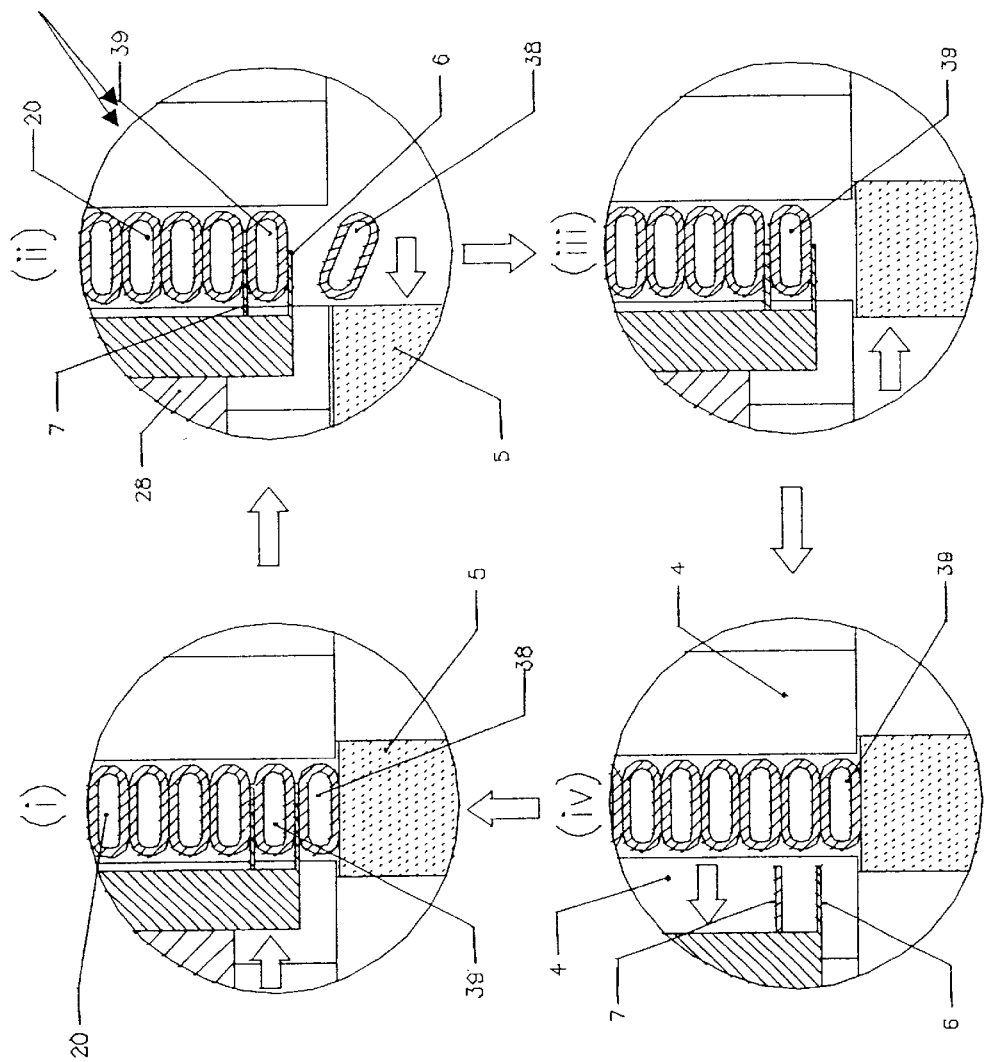
FIGS. 7(*i*), (*ii*), (*iii*), and (*iv*) are side views of the tube off-loading apparatus showing an operational sequence of tube renewal.

The tube renewal sequences and the tube separation mechanism are shown in FIG. 7. FIG. 7(*i*) shows that both the movable support platform 5 and tube separation assembly 28 are at 'in' or forward position to hold all the tubes in position. The fingers 6 of the separation assembly will clamp onto the loading tube 38. Finger 6 together with finger 7 will hold onto the tube 39 and prevent it from tilting. The tube 39 is just on top of the loading tube 38. The rest of the standby tubes 20 are supported by the fingers 6 and 7 of the tube separation assembly.

FIG. 7(*ii*) shows that the support platform 5 moves out to the left; the tube 38 is unloaded and the rest of the tubes on the above are held by the fingers 6 and 7 of the tube separation assembly. The unloaded tube will drop into the tube collector 21 underneath.

FIG. 7(*iii*) shows that the movable support platform 5 moves in and returns to its forward position. It is ready for supporting a new loading tube.

FIG. 7(*iv*) shows that the tube separation assembly 28 moves out to its backward position. This allows the column of tubes 20 to free fall and drop on to the support platform 5 under the guiding of the guiding brackets 4. The tube 39 will fall to the bottom and it becomes the bottom tube 38 for loading the incoming package 24.

The cycle will be repeated as the tube separation assembly 28 moves back to its forward position and the fingers 6 and 7 will insert into the standby tubes 20 again as in FIG. 7(*i*). The newly loaded tube will be pushed into the tube guiding blocks 10 for receiving the incoming packages 24 as mentioned before. During normal operation, the standby tubes 20 will be used up one by one and the filled tubes can be consolidated in the tube collector 21. If the level of the standby tubes is lower than the sensor 33, a warning signal will be given to ask the user to refill the tubes.

Figure 8:
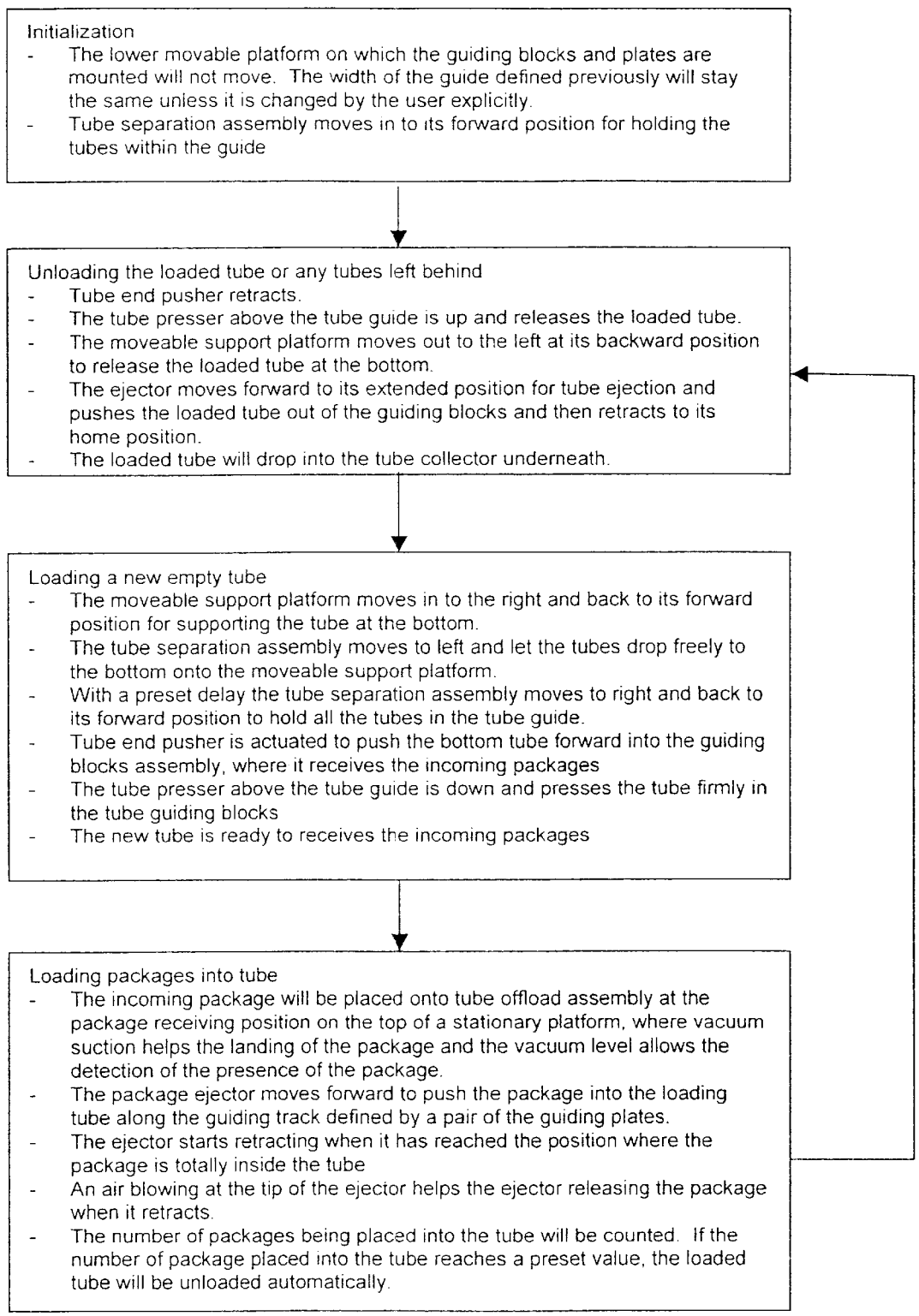
FIG. 8 is a flow diagram of the various operational sequences of the described embodiment of the present invention.

FIG. 8 is a flow diagram of the various operational sequences of the described embodiment of the present invention.

The invention described herein is susceptible to variations, modifications and/or additions other than those specifically described and it is to be understood that the invention includes all such variations, modifications and/or additions which fall within the spirit and scope of the above description.

What is claimed is:

1. An apparatus to load items of varying dimensions into a plurality of stacked tubes having varying dimension, comprising:
   a first guide arrangement programmable to receive the items by automatically configuring to accommodate the varying dimensions of the items;
   a second guide arrangement programmable to receive the stacked tubes by automatically configuring to accommodate the varying dimensions of the stacked tubes;
   a tube separation arrangement configured to individually remove the stacked tubes; and
   an alignment arrangement configured to individually align the removed tubes with the first guide arrangement to receive the items;
   wherein, upon application of a feeding force to the items, the first guide arrangement guides the items into the tubes.

2. The apparatus according to claim 1, wherein the second guide arrangement further includes
   a movable block;
   a motor arrangement rotatably coupled to the moveable block to controllably cause reciprocation of the moveable block along a first reciprocation direction, the motor arrangement including an encoder to encode a characteristic of the motor arrangement, the reciprocation of the moveable block being controlled in accordance with the encoded characteristic;
   a plurality of cam follower pairs arranged on respective sides of the apparatus, each of the pairs including two cam followers having respective first and second ends, the first ends being pivotally coupled to the movable block;
   a plurality of linear guides;
   a first pair of moveable platforms mounted on the linear guides and arranged on the respective sides of the apparatus; and
   a plurality of cam-follower guides coupled to the first pair of moveable platforms, the cam-follower guides including sloped channels to loosely and respectively receive the second ends of the cam followers, wherein
   the reciprocation of the moveable block causes the second ends of the cam followers to move along the sloped channels of the cam follower guides, thereby causing the first pair of moveable platforms to reciprocate with respect to one another along a second direction of reciprocation substantially perpendicular to the first direction of reciprocation of the moveable block.

3. The apparatus according to claim 2, wherein the second guide arrangement further includes a guiding assembly and a pair of second moveable platforms coupled to the first pair of moveable platforms, the second pair of moveable platforms configured to accommodate the guiding assembly to receive the stacked tubes.

4. The apparatus according to claim 3, wherein the guiding assembly of the second guide arrangement includes a pair of guiding blocks to guide the stacked tubes, and the first guide arrangement includes a pair of guiding plates to guide the items into the tubes, the pair of plates automatically configuring to accommodate the varying dimensions of the items.

5. The apparatus according to claim 4, wherein the guiding blocks and guiding plates are arranged on respective ones of the moveable platforms.

6. The apparatus according to claim 5, further comprising an ejector to apply the feeding force to guide the items into the tubes.

7. The apparatus according to claim 5, wherein the guide plates are configured to accommodate the varying dimensions of the items with a suitably selected clearance.

8. The apparatus according to claim 7, wherein a width of separation between the guiding blocks and the plates is adjustable in accordance with a separation between the moveable platforms.

9. The apparatus according to claim 8, wherein the guiding blocks define a width of a guide for the stacked tubes, and a width of a track for the items has a fixed relationship depending on the dimensions of the stacked tubes.

10. The apparatus according to claim 4, wherein the guiding assembly includes a first stopper fixed and arranged near an open end of a tube to be filled, the guiding assembly further including a second stopper movably arranged at a closed end of the tube to be filled, the guiding assembly further including two pairs of guiding brackets respectively arranged at front and rear sides of the apparatus.

11. The apparatus according to claim 10, wherein the second stopper is moveably adjustable in accordance with a length of the tube to be filled.

12. The apparatus according to claim 11, wherein a width of the guiding brackets is configurable to accommodate a column of the stacked tubes to be filled with items.

13. The apparatus according to claim 12, wherein central axes of the guiding blocks and the guiding plates are substantially coincident.

14. The apparatus according to claim 13, wherein the width of the guiding plates, the width of the guiding blocks, and the width of the guiding brackets are configured to be programmably adjusted simultaneously.

15. The apparatus according to claim 2, wherein the cam-followers include four cam followers mounted on the respective sides of the apparatus, and the motor arrangement includes a lead screw coupled to the moveable block.

16. The apparatus according to claim 15, wherein a width of separation between the first pair of movable platforms is programmable in accordance with the encoded characteristic of the motor arrangement.

17. The apparatus according to claim 1, wherein a width of the second guide arrangement is programmable.

18. The apparatus according to claim 17, further comprising a support platform having a vacuum arrangement to provide a vacuum to hold the items before being fed into the tubes.

19. The apparatus according to claim 18, wherein the support platform includes orifices through which the vacuum is drawn, the apparatus further comprising:
   a detection arrangement configured to detect a presence of the items in accordance with the vacuum drawn through the orifices.

20. The apparatus according to claim 1, wherein the tube separation arrangement includes a plurality of support fingers configured to frictionally engage the stacked tubes.

21. The apparatus according to claim 20, wherein the plurality of support fingers include three support fingers.

22. The apparatus according to claim 21, wherein two of the support fingers are respectively arranged at front and rear ends of the apparatus, and a third one of the fingers is arranged adjacent to a central axis of a tube to be filled.

23. The apparatus according to claim 22, wherein the fingers are configured to support the stacked tubes inside the second guide arrangement, the fingers respectively arranged at the front and rear ends of the apparatus being configured to individually removing the stacked tubes.

24. The apparatus according to claim 23, wherein the tube separation arrangement includes a moveable bracket configured to reciprocate the fingers to individually remove the stacked tubes.

25. The apparatus according to claim 24, wherein the tube separation arrangement includes a solenoid configured to act upon the moveable bracket.

26. The apparatus according to claim 25, further comprising a renewal mechanism to renew the stacked tubes, the renewal mechanism including a moveable support platform, a tube end pusher coupled to the moveable support platform, a tube presser, and an ejector to push a tube out of the guiding blocks.

27. The apparatus according to claim 26, wherein the moveable support platform is configured to provide mechanical support for a tube to be filled with items.

28. The apparatus according to claim 27, wherein the tube separation arrangement is operable to unload a bottom tube, by the moveable support platform being moveable transversely laterally thereby no longer positioned to support a loaded tube, by the tube end pusher being retractable and by the tube presser being operable to release the loaded tube.

29. The apparatus according to claim 28, wherein the ejector is operable to be moved to an extended position to push a tube out of the guide blocks, whereby at an extended position of the ejector, the tube falls freely into a tube collector.

30. The apparatus according to claim 29, wherein the movable support platform is configured to retract and the tube separation arrangement is extendable to allow tubes inside the guiding brackets to fall onto the support platform, whereby the tube separation arrangement is operable with the fingers to enter a column of the stacked tubes to separate a bottom tube from tubes above the bottom tube, and the tube pusher is operable to push the bottom tube between the guiding blocks and the tube presser is operable to press the bottom tube down against the guiding blocks to hold the bottom tube in position.

31. The apparatus according to claim 30, wherein the ejector is operable to push incoming items into the bottom tube by moving forward to a normal loading position, the ejector being further operable to move forward to an extended position to eject the bottom tube when a tube unloading cycle is initiated.

* * * * *